United States Patent
Chen et al.

(10) Patent No.: US 9,865,539 B2
(45) Date of Patent: Jan. 9, 2018

(54) STRUCTURE AND FORMATION METHOD OF SEMICONDUCTOR DEVICE STRUCTURE

(71) Applicant: TAIWAN SEMICONDUCTOR MANUFACTURING CO., LTD., Hsinchu (TW)

(72) Inventors: Jian-Hua Chen, Hsinchu (TW); Tai-I Yang, Hsinchu (TW); Cheng-Chi Chuang, New Taipei (TW); Chia-Tien Wu, Taichung (TW); Tien-Lu Lin, Hsinchu (TW); Tien-I Bao, Taoyuan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/065,310

(22) Filed: Mar. 9, 2016

(65) Prior Publication Data

US 2017/0263548 A1 Sep. 14, 2017

(51) Int. Cl.
*H01L 23/528* (2006.01)
*H01L 21/768* (2006.01)
*H01L 23/522* (2006.01)

(52) U.S. Cl.
CPC ...... *H01L 23/528* (2013.01); *H01L 21/76802* (2013.01); *H01L 21/76825* (2013.01); *H01L 21/76834* (2013.01); *H01L 21/76877* (2013.01); *H01L 23/5226* (2013.01)

(58) Field of Classification Search
CPC ................... H01L 21/76802; H01L 21/76825
See application file for complete search history.

(56) References Cited

U.S. PATENT DOCUMENTS

| | | | | |
|---|---|---|---|---|
| 2007/0272963 | A1* | 11/2007 | Kishida | H01L 27/10852 257/301 |
| 2010/0093168 | A1* | 4/2010 | Naik | H01L 21/31144 438/618 |
| 2010/0301489 | A1* | 12/2010 | Seidel | H01L 21/76804 257/773 |
| 2014/0252636 | A1* | 9/2014 | Chen | H01L 21/7682 257/773 |
| 2015/0243544 | A1* | 8/2015 | Alptekin | H01L 21/7682 438/586 |

\* cited by examiner

*Primary Examiner* — Errol Fernandes
(74) *Attorney, Agent, or Firm* — Birch, Stewart, Kolasch & Birch, LLP

(57) ABSTRACT

Structures and formation methods of a semiconductor device structure are provided. The method includes forming a dielectric layer over a semiconductor substrate. The method also includes forming an opening in the dielectric layer. A dielectric constant of a first portion of the dielectric layer is less than that of a second portion of the dielectric layer surrounding the opening. The method further includes forming a conductive feature in the opening. The second portion is between the first portion and the conductive feature. In addition, the method includes modifying an upper portion of the first portion to increase the dielectric constant of the upper portion of the first portion. The method also includes removing the upper portion of the first portion and the second portion.

20 Claims, 7 Drawing Sheets

STRUCTURE AND FORMATION METHOD OF SEMICONDUCTOR DEVICE STRUCTURE

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying FIGURES. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
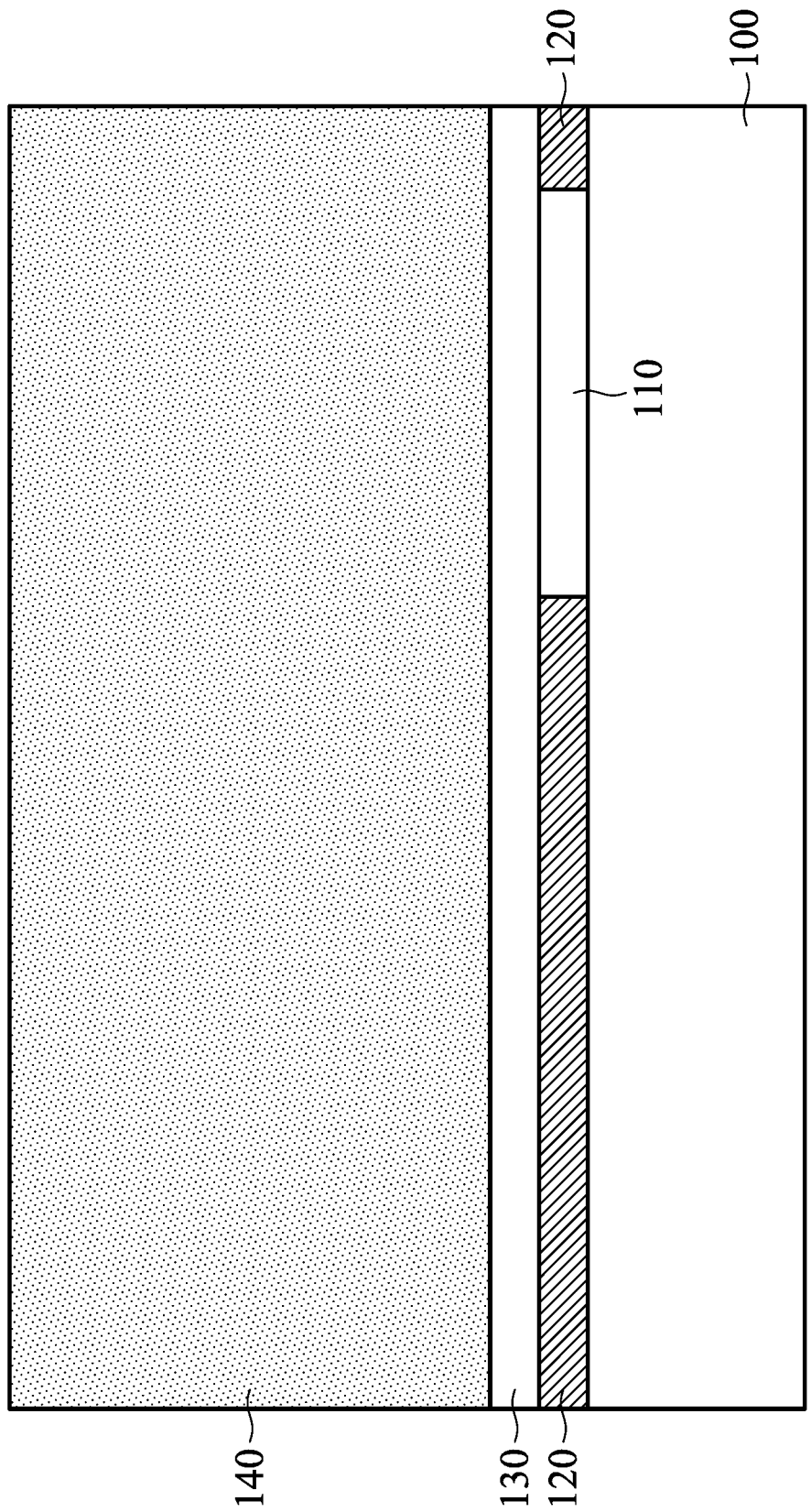
FIGS. 1A-1G are cross-sectional views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the FIGURES. The spatially relative terms are intended to encompass different orientations of the device in use or operation in addition to the orientation depicted in the FIGURES. The apparatus may be otherwise oriented (rotated 90 degrees or at other orientations) and the spatially relative descriptors used herein may likewise be interpreted accordingly.

Some embodiments of the disclosure are described. FIGS. 1A-1G are cross-sectional views of various stages of a process for forming a semiconductor device structure, in accordance with some embodiments. Additional operations can be provided before, during, and/or after the stages described in FIGS. 1A-1G. Some of the stages that are described can be replaced or eliminated for different embodiments. Additional features can be added to the semiconductor device structure. Some of the features described below can be replaced or eliminated for different embodiments.

As shown in FIG. 1A, a semiconductor substrate 100 is provided. In some embodiments, the semiconductor substrate 100 is a bulk semiconductor substrate, such as a semiconductor wafer. For example, the semiconductor substrate 100 is a silicon wafer. The semiconductor substrate 100 may include silicon or another elementary semiconductor material such as germanium. In some other embodiments, the semiconductor substrate 100 includes a compound semiconductor. The compound semiconductor may include silicon germanium, gallium arsenide, silicon carbide, indium arsenide, indium phosphide, another suitable compound semiconductor, or a combination thereof.

In some embodiments, the semiconductor substrate 100 includes a semiconductor-on-insulator (SOI) substrate. The SOI substrate may be fabricated using a wafer bonding process, a silicon film transfer process, a separation by implantation of oxygen (SIMOX) process, another applicable method, or a combination thereof.

In some embodiments, isolation features (not shown) are formed in the semiconductor substrate 100. The isolation features are used to define active regions and electrically isolate various device elements formed in and/or over the semiconductor substrate 100 in the active regions. In some embodiments, the isolation features include shallow trench isolation (STI) features, local oxidation of silicon (LOCOS) features, other suitable isolation features, or a combination thereof.

Examples of the various device elements, which may be formed in the semiconductor substrate 100, include transistors, diodes, another suitable element, or a combination thereof. For example, the transistors may be metal oxide semiconductor field effect transistors (MOSFET), complementary metal oxide semiconductor (CMOS) transistors, bipolar junction transistors (BJT), high voltage transistors, high-frequency transistors, p-channel and/or n channel field effect transistors (PFETs/NFETs), etc. Various processes are performed to form the various device elements, such as deposition, etching, implantation, photolithography, annealing, planarization, another applicable process, or a combination thereof.

In some embodiments, an interconnection structure is formed on the semiconductor substrate 100. The interconnection structure includes an interlayer dielectric layer (ILD) 110 and multiple conductive features including conductive features 120 in the interlayer dielectric layer 110. The conductive features 120 may include conductive lines, conductive vias, and/or conductive contacts. In some embodiments, the interlayer dielectric layer 110 includes multiple dielectric sub-layers. Multiple conductive features such as conductive contacts, conductive vias, and conductive lines are formed in the interlayer dielectric layer 110.

In some embodiments, the interlayer dielectric layer 110 is made of silicon oxide, borosilicate glass (BSG), phosphoric silicate glass (PSG), borophosphosilicate glass (BPSG), fluorinated silicate glass (FSG), porous dielectric material, another suitable low-k dielectric material, or a combination thereof. In some embodiments, the conductive features 120 are made of copper, aluminum, gold, titanium, cobalt, tungsten, another suitable conductive material, or a combination thereof. Various processes, including deposition, etching, planarization, or the like, may be used to form the interlayer dielectric layer 110 and the conductive features 120.

Afterwards, one or more dielectric layers and conductive features are formed on the interlayer dielectric layer 110 and the conductive features 120 to continue the formation of the interconnection structure. Various device elements are interconnected through the interconnection structure over the semiconductor substrate 100 to form integrated circuit devices. For example, one of the conductive features 120 may be electrically connected to a doped region formed in the semiconductor substrate 100 through some of the conductive features including conductive vias, conductive lines, and/or conductive contacts. The integrated circuit devices include logic devices, memory devices (e.g., static random access memories, SRAMs), radio frequency (RF) devices, input/output (I/O) devices, system-on-chip (SoC) devices, image sensor devices, other applicable types of devices, or a combination thereof.

As shown in FIG. 1A, an etch stop layer 130 is deposited over the interlayer dielectric layer 110 and the conductive features 120, in accordance with some embodiments. The etch stop layer 130 is used to protect the conductive features 120 from damage during subsequent processes for forming openings.

In some embodiments, the etch stop layer 130 is made of silicon carbide (SiC), silicon carbo-nitride (SiCN), silicon oxycarbide (SiCO), silicon nitride (SiN), silicon oxynitride (SiON), metal oxide, metal nitride, another suitable material, or a combination thereof. In some embodiments, the etch stop layer 130 is deposited using a chemical vapor deposition (CVD) process, a spin-on process, another applicable process, or a combination thereof. Embodiments of the disclosure are not limited thereto. In some other embodiments, the etch stop layer 130 is not formed.

As shown in FIG. 1A, a dielectric layer 140 is deposited over the etch stop layer 130, in accordance with some embodiments. The dielectric layer 140 may serve as an inter-metal dielectric (IMD) layer. In some embodiments, the dielectric layer 140 is made of a low-k dielectric material. The low-k dielectric material has a smaller dielectric constant than that of silicon dioxide. For example, the low-k dielectric material has a dielectric constant in a range from about 1.2 to about 3.5.

As the density of semiconductor devices increases and the size of circuit elements becomes smaller, the resistance capacitance (RC) delay time increasingly dominates circuit performance. Using a low-k dielectric material as the dielectric layer 140 is helpful for reducing the RC delay.

In some embodiments, the dielectric layer 140 includes a carbon-containing material. For example, the dielectric layer 140 includes SiOC, SiCOH, SiOCN, or a combination thereof. In some embodiments, the dielectric layer 140 is made of carbon-doped silicon oxide. The carbon-doped silicon oxide may also be referred to as organosilicate glass (OSG) or C-oxide. In some embodiments, the carbon-doped silicon oxide includes methyl silsesquioxane (MSQ), hydrogen silsesquioxane (HSQ), polysilsesquioxane, another suitable material, or a combination thereof. In some embodiments, the dielectric layer 140 is deposited using a CVD process, a spin-on process, a spray coating process, another applicable process, or a combination thereof.

Figure 1B:
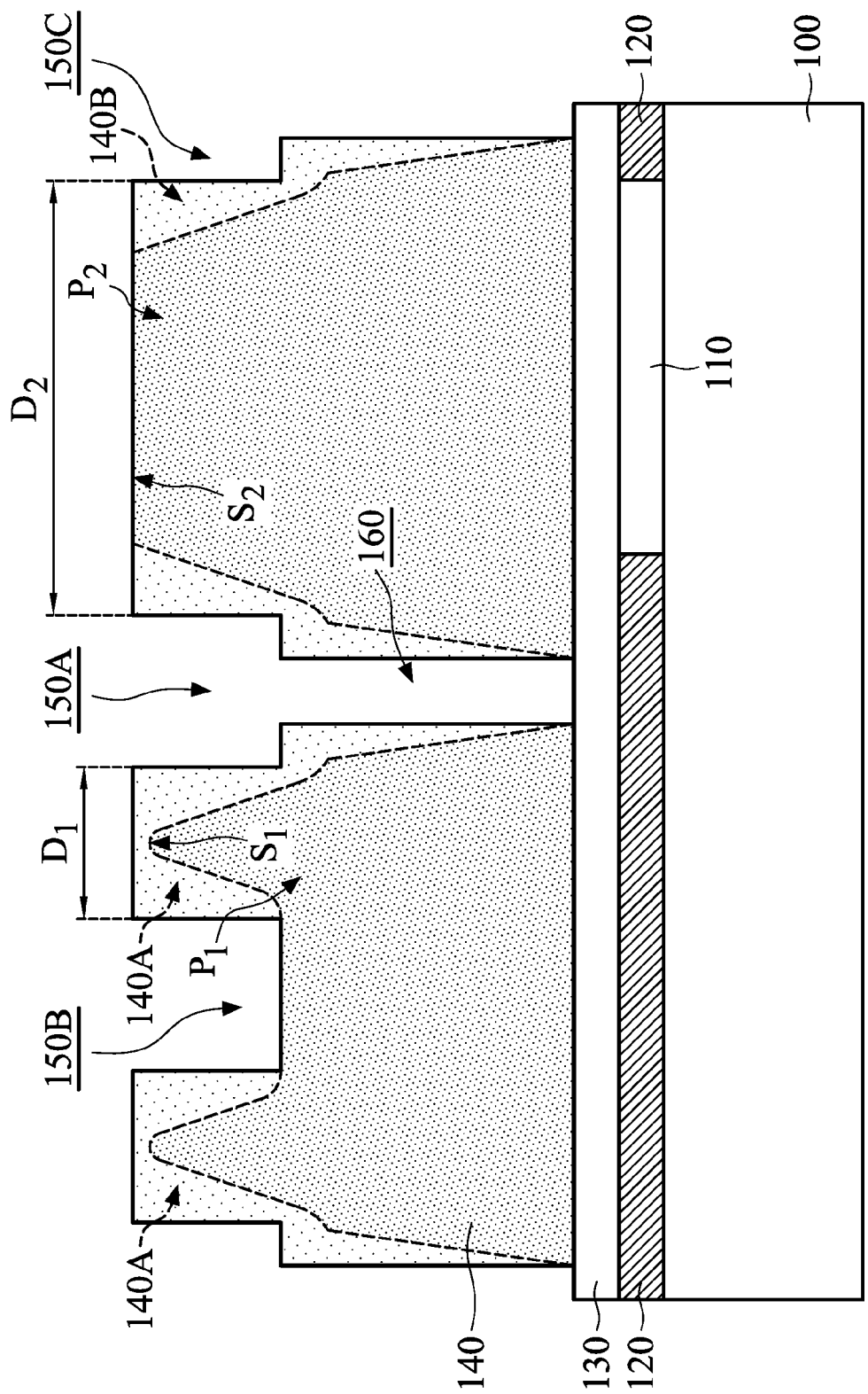

Afterwards, openings are formed in the dielectric layer 140. In some embodiments, the openings include trenches, via holes, or a combination thereof. As shown in FIG. 1B, some of the trenches (such as openings 150A, 150B, and 150C) and some of the via holes (such as an opening 160) are formed, in accordance with some embodiments.

The opening 150A is located laterally between the opening 150B and the opening 150C. The opening 150A is separated from the opening 150B by a distance $D_1$. The opening 150A is separated from the opening 150C by a distance $D_2$. In some embodiments, the distance $D_1$ is less than the distance $D_2$. In some embodiments, the distance $D_1$ is in a range from about 1 nm to about 30 nm.

Many variations and/or modifications can be made to embodiments of the disclosure. In some other embodiments, the distance $D_1$ is equal to the distance $D_2$.

In some embodiments, the dielectric layer 140 is a single layer. There is no etch stop layer lining the bottom surface of the openings 150A, 150B, and 150C.

In some embodiments, the opening 150A and the opening 160 are connected to each other and together penetrate the dielectric layer 140. In some embodiments, the opening 160 extends from the bottom surface of the opening 150A. In some embodiments, the opening 160 exposes a portion of the etch stop layer 130. In some other embodiments, the opening 160 exposes one of the conductive features 120.

As shown in FIG. 1B, the opening 150A is wider than the opening 160 as viewed from a cross-sectional view, in accordance with some embodiments. The cross-sectional view may be taken along a plane that is perpendicular to the main surface of the semiconductor substrate 100. In some other embodiments, the opening 150A and the opening 160 have the same width as viewed from the cross-sectional view.

In some embodiments, the openings 150A, 150B, 150C, and 160 are formed using multiple photolithography processes and etching processes. In some embodiments, the opening 160 is formed before the formation of the openings 150A, 150B, and 150C. For example, the openings 150A, 150B, 150C, and 160 are formed using a "via first" process. In some other embodiments, the openings 150A, 150B, and 150C are formed before the formation of the opening 160. For example, the openings 150A, 150B, 150C, and 160 are formed using a "trench first" process.

As shown in FIG. 1B, multiple portions 140A and 140B are formed in the dielectric layer 140, in accordance with some embodiments. The portions 140A are between some of the dense openings while the portions 140B are between some of the sparse openings. In some embodiments, the portions 140A surround some of the dense openings, and the portions 140B surround some of the sparse openings. For example, one or some of the portions 140A are within a region with the distance $D_1$ and between the opening 150A and the opening 150B. One or some of the portions 140B are within a region with the distance $D_2$ and between the opening 150A and the opening 150C.

In some embodiments, the portions 140A have different dielectric constants than that of a first portion $P_1$ of the dielectric layer 140 which adjoins the portions 140A. In some embodiments, the portions 140B have different dielectric constants than that of a second portion $P_2$ of the dielectric layer 140 which adjoins the portions 140B. For example, the dielectric constant of the portions 140A and 140B is greater than that of the first portion $P_1$ and the second portion $P_2$.

Interfaces between the portions 140A and the first portion $P_1$ and between the portions 140B and the second portion $P_2$ may be observed using a spectrometer. These interfaces are shown by dotted lines in FIGURES. In some embodiments, the spectrometer is an electron energy loss spectrometer (EELS), or another suitable spectrometer.

In some embodiments, the first portion $P_1$ and the second portion $P_2$ include a carbon-containing dielectric material. The carbon-containing dielectric material of the first portion $P_1$ and the second portion $P_2$ may include $SiOC_x$ (0<x≤2), $SiC_xOH$ (0<x≤3), $SiOC_xN$ (0<x≤1), another suitable dielectric material, or a combination thereof.

In some embodiments, the portions 140A and 140B include a carbon-containing dielectric material. In some embodiments, the carbon concentration of the portions 140A and 140B is different from that of the first portion $P_1$ and the second portion $P_2$. For example, the carbon concentration of the portions 140A and 140B is less than that of the first portion $P_1$ and the second portion $P_2$. A spectrometer, such as an EELS, may be used to measure carbon concentration. In some embodiments, the carbon-containing dielectric material of the portions 140A and 140B include $SiOC_{x-y}$ (0<y<x), $SiC_{x-y}OH$ (0<y<x), $SiOC_{x-y}N$ (0<y<x), another suitable dielectric material, or a combination thereof.

In some embodiments, the portions 140A between the opening 150A and the opening 150B are connected with each other. As a result, a top surface $S_1$ of the first portion $P_1$ is covered by the portions 140A. In some embodiments, the top surface $S_1$ is non-coplanar with a top surface $S_2$ of the second portion $P_2$, as shown in FIG. 1B.

Embodiments of the disclosure are not limited thereto. In some other embodiments, some of the portions 140A between the opening 150A and the opening 150B are separated from each other. As a result, the top surface $S_1$ of the first portion $P_1$ is substantially coplanar with the top surface $S_2$ of the second portion $P_2$.

In some embodiments, the portions 140B between the opening 150A and the opening 150C are separated from each other by the second portion $P_2$. In some other embodiments, the portions 140B between the opening 150A and the opening 150C are connected with each other.

In some embodiments, the sidewalls and the bottom surface of the opening 150A are lined with one of the portions 140A and one of the portions 140B. In some embodiments, one of the portions 140A and one of the portions 140B further extends along the sidewalls of the opening 160. In some embodiments, one of the portions 140A and one of the portions 140B together continuously surround the opening 150A and the opening 160.

In some embodiments, the sidewalls of the opening 150B are lined with some of the portions 140A. In some embodiments, the bottom surface of the opening 150B is substantially not surrounded by the portions 140A. In some other embodiments, the bottom surface of the opening 150B is lightly lined with some of the portions 140A. In some embodiments, some of the portions 140B continuously surround the sidewalls and the bottom surface of the opening 150C.

In some embodiments, some surface portions of the dielectric layer 140 are exposed through the openings 150A, 150B, 150C, and 160, and are modified and transformed into the portions 140A and 140B. As a result, the portions 140A and 140B extend from the exposed surfaces of the dielectric layer 140 towards the interior of the dielectric layer 140. In some embodiments, some surface portions of the dielectric layer 140, which are exposed through the openings 150A, 150B, 150C, and 160, are damaged and are transformed into the portions 140A and 140B.

In some embodiments, the portions 140A and 140B are formed during the formation of the openings 150A, 150B, 150C, and 160 or by performing another suitable process. In some embodiments, the portions 140A and 140B are formed due to one or more etching processes for forming the openings 150A, 150B, 150C, and 160. In some embodiments, the portions 140A and 140B are formed due to the removal of one or more mask layers used in one or more etching processes for forming the openings 150A, 150B, 150C, and 160.

In some embodiments, the portions 140A and 140B are formed due to an etching process and the removal of a mask layer. In some embodiments, the etching process and/or the removal of the mask layer include a plasma-involved process.

In some embodiments, the dielectric constant of the exposed surface portions of the dielectric layer 140 is changed during the formation of the openings 150A, 150B, 150C, and 160. In some embodiments, the dielectric constant of the exposed surface portions of the dielectric layer 140 is increased after the portions 140A and 140B are formed. As a result, the dielectric constant of the portions 140A or 140B is greater than that of the first portion $P_1$ or the second portion $P_2$.

In some embodiments, the carbon concentration of the exposed surface portions of the dielectric layer 140 is changed during the formation of the openings 150A, 150B, 150C, and 160. In some embodiments, the carbon concentration of the exposed surface portions of the dielectric layer 140 is reduced after the portions 140A and 140B are formed. As a result, the carbon concentration of the portions 140A and 140B is less than that of the first portion $P_1$ and the second portion $P_2$.

Figure 1C:
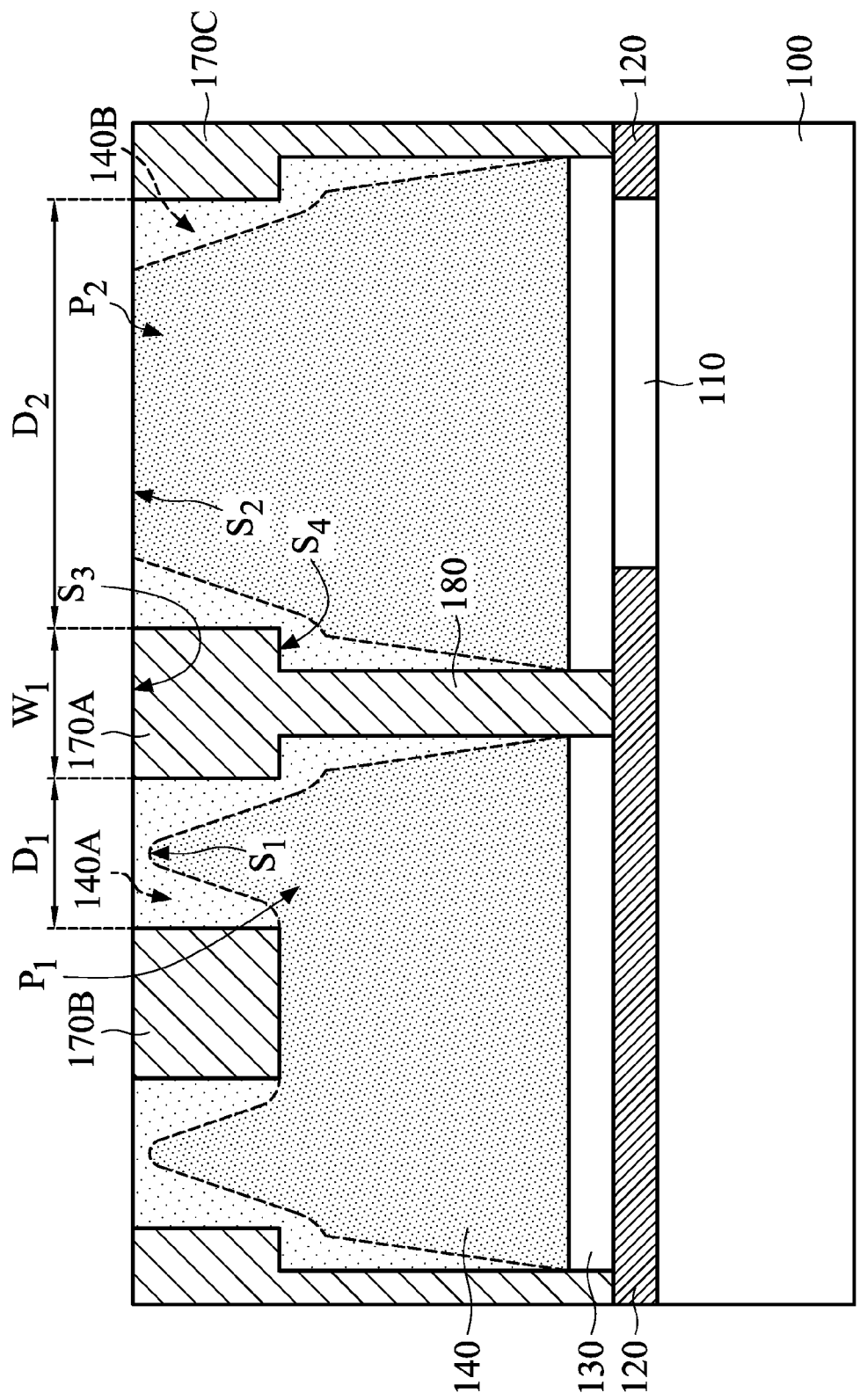

As shown in FIG. 1C, a portion of the etch stop layer 130 exposed from the opening 160 is removed, in accordance with some embodiments. As a result, one of the conductive features 120 is partially exposed from the opening 160.

Afterwards, conductive features are formed in the openings of the dielectric layer 140, in accordance with some embodiments. In some embodiments, the conductive features include conductive lines, conductive vias, or a combination thereof. The conductive lines are formed in the trenches, and the conductive vias are formed in the via holes. Each of the conductive features in the openings of the dielectric layer 140 is electrically connected to one of the conductive features 120.

As shown in FIG. 1C, some of the conductive lines (such as conductive features 170A, 170B, and 170C) and some of the conductive vias (such as a conductive feature 180) are formed. The conductive features 170A, 170B, and 170C are respectively formed in the openings 150A, 150B, and 150C. The conductive feature 180 is formed in the opening 160 and is electrically connected to one of the conductive features 120.

One or each of the conductive features 170A, 170B, and 170C has a width $W_1$. In some embodiments, the width $W_1$ is equal to the distance $D_1$ between the conductive features 170A and 170B. In some other embodiments, the width $W_1$ is less than the distance $D_1$. In some other embodiments, the width $W_1$ is greater than the distance $D_1$. In some embodiments, the width $W_1$ is referred to as the minimum line width. In some embodiments, the distance $D_1$ is equal to the minimum line width. In some embodiments, the distance $D_2$ between the conductive features 170A and 170C is greater than the minimum line width.

The conductive feature 170A has a top surface $S_3$ and a bottom surface $S_4$. The conductive feature 180 extends from the bottom surface $S_4$ to one of the conductive features 120. In some embodiments, the top surface $S_3$ is non-coplanar with the top surface $S_1$ of the first portion $P_1$ of the dielectric layer 140. In some embodiments, the top surface $S_1$ is lower than the top surface $S_3$ and is higher than the bottom surface $S_4$. In some embodiments, the top surface $S_3$ is closer to the top surface $S_1$ than the bottom surface $S_4$. In some embodiments, the top surface $S_3$ is substantially coplanar with the top surface $S_2$ of the second portion $P_2$ of the dielectric layer 140.

In some embodiments, one of the portions 140A and one of the portions 140B gradually become narrower along a direction from the top surface $S_3$ of conductive feature 170A towards the bottom surface $S_4$ of conductive feature 170A. In some embodiments, one of the portions 140A and one of the portions 140B gradually become narrower along the direction from the top surface of the conductive feature 180 towards the bottom surface the conductive feature 180. In some embodiments, one of the portions 140A and one of the portions 140B gradually become narrower along the direction from the top surface $S_3$ of conductive feature 170A towards the bottom surface the conductive feature 180.

In some embodiments, the conductive features 170A and 180 are in direct contact with the portions 140A and 140B. In some embodiments, the conductive feature 170B is in direct contact with the portions 140A. In some embodiments, the conductive feature 170C is in direct contact with the portions 140B.

Embodiments of the disclosure are not limited thereto. In some other embodiments, one or more of the conductive features 170A, 170B, and 180 are not in direct contact with the portions 140A. In some other embodiments, one or more of the conductive features 170A, 170C, and 180 are not in direct contact with the portions 140B.

In some embodiments, one of the portions 140A is sandwiched between the first portion $P_1$ of the dielectric layer 140 and the conductive feature 170A or 170B. In some embodiments, one of the portions 140B is sandwiched between the second portion $P_2$ of the dielectric layer 140 and the conductive feature 170A or 170C.

In some embodiments, the conductive features 170A, 170B, 170C, and 180 are made of copper, aluminum, tungsten, titanium, nickel, gold, platinum, silver, another suitable material, or a combination thereof. Each of the conductive features 170A, 170B, 170C, and 180 may be a single layer or have multiple stacked layers.

In some embodiments, one or more conductive material layers are deposited over the dielectric layer 140 to fill the openings 150A, 150B, 150C, and 160. In some embodiments, the one or more conductive material layers are deposited using an electroplating process, a PVD process, a CVD process, an electroless plating process, another applicable process, or a combination thereof.

Afterwards, a planarization process is used to remove the conductive material layers outside of the openings 150A, 150B, 150C, and 160. The planarization process may include a chemical mechanical polishing (CMP) process, a dry polishing process, a grinding process, an etching process, another applicable process, or a combination thereof. As a result, the remaining portions of the conductive material layers in the openings 150A, 150B, and 150C, form the conductive features 170A, 170B, and 170C. The remaining portions of the conductive material layers in the opening 160 form the conductive feature 180.

In some other embodiments, before the conductive material layers are deposited, a barrier layer (not shown) is formed over the dielectric layer 140 and over the sidewalls and the bottom surfaces of the openings 150A, 150B, 150C, and 160. For example, the barrier layer is conformally deposited over the dielectric layer 140 and in the openings 150A, 150B, 150C, and 160. After the planarization process for forming the conductive features 170A, 170B, 170C, and 180, the barrier layer on the top surface of the dielectric layer 140 is also removed. As a result, the conductive features 170A, 170B, 170C, and 180 are separated from the portions 140A and 140B by the barrier layer.

The barrier layer can protect the dielectric layer 140 from diffusion of a metal material from the conductive features 170A, 170B, 170C, and 180. In some embodiments, the barrier layer includes multiple sub-layers including a glue layer (not shown). The glue layer may be used to improve adhesion between the barrier layer and a subsequently formed layer.

In some embodiments, the barrier layer is made of tantalum nitride, titanium nitride, tungsten nitride, another suitable material, or a combination thereof. The glue layer may be made of tantalum, titanium, another suitable material, or a combination thereof. In some embodiments, the barrier layer is deposited using a PVD process, a CVD process, another applicable process, or a combination thereof. Many variations and/or modifications can be made to embodiments of the disclosure. In some other embodiments, the barrier layer is not formed.

Figure 1D:
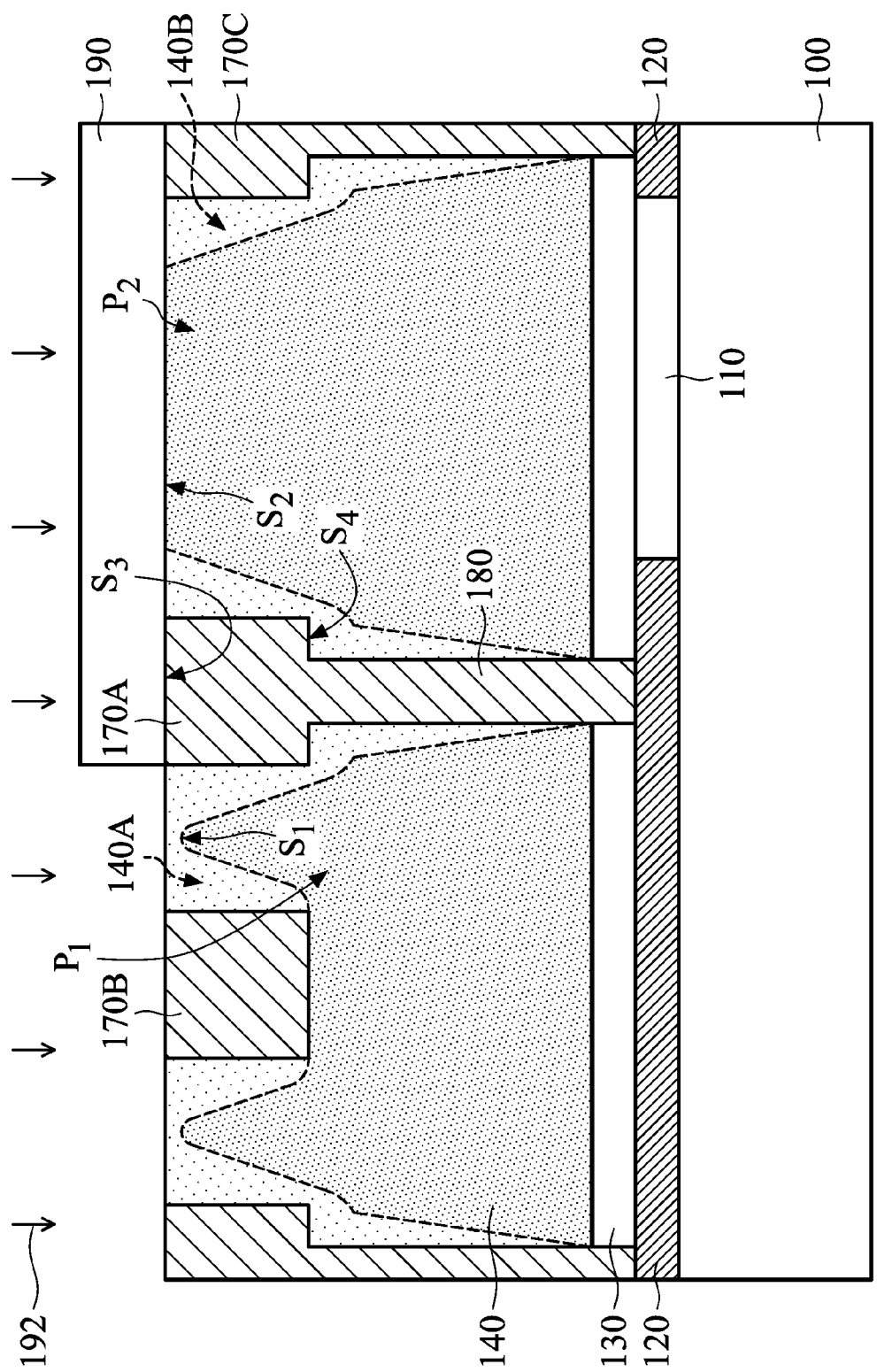

As shown in FIG. 1D, a patterned mask layer 190 is formed over the dielectric layer 140, in accordance with some embodiments. The patterned mask layer 190 is used to assist in a subsequent treatment.

In some embodiments, the patterned mask layer 190 has an opening exposing a region where dense conductive features are located. Another region where sparse conductive features are located is covered by the patterned mask layer 190. For example, a region between the conductive features 170A and 170B is exposed from the opening of the patterned mask layer 190. Another region between the conductive features 170A and 170C are covered by the patterned mask layer 190. As a result, the portions 140A are exposed from the opening of the patterned mask layer 190 while the portions 140B are covered by the patterned mask layer 190.

Many variations and/or modifications can be made to embodiments of the disclosure. In some other embodiments, a region where dense conductive features are located and another region where some sparse conductive features are located are exposed from the opening of the patterned mask layer 190. Another region where some other sparse conductive features are located is covered by the patterned mask layer 190.

In some embodiments, the conductive feature 170A is covered by the patterned mask layer 190. The conductive feature 170B closer to the conductive feature 170A is exposed from the opening of the patterned mask layer 190 while the conductive feature 170C farther from the conductive feature 170A is covered by the patterned mask layer 190. In some other embodiments, the conductive feature 170B is also covered by the patterned mask layer 190. Accordingly, the conductive feature 170B may be prevented from being damaged during subsequent processes.

Many variations and/or modifications can be made to embodiments of the disclosure. In some other embodiments, the conductive feature 170A is exposed from the opening of the patterned mask layer 190. One or more of the portions 140B between the conductive features 170A and 170C are also exposed from the opening of the patterned mask layer 190.

In some embodiments, the patterned mask layer 190 is a patterned photoresist layer. For example, a photoresist layer is deposited over the dielectric layer 140. Afterwards, the photoresist layer is patterned by one or more photolithography processes. As a result, the patterned mask layer 190 is formed.

In some other embodiments, the patterned mask layer 190 is made of silicon oxide, silicon nitride, another suitable material, or a combination thereof. For example, a mask material layer is deposited over the dielectric layer 140. A patterned photoresist is used as an etching mask to pattern the mask material layer. Afterwards, one or more etching processes are used to transfer the pattern of the patterned photoresist to the mask material layer. As a result, the patterned mask layer 190 is formed. The patterned photoresist is subsequently removed.

As shown in FIG. 1D, an upper portion of the first portion $P_1$ of the dielectric layer 140 is modified using a modification operation 192, in accordance with some embodiments. As a result, the upper portion of the first portion $P_1$ that is modified and the portions 140A together form a portion 140A', as shown in FIG. 1E in accordance with some embodiments.

Figure 1E:
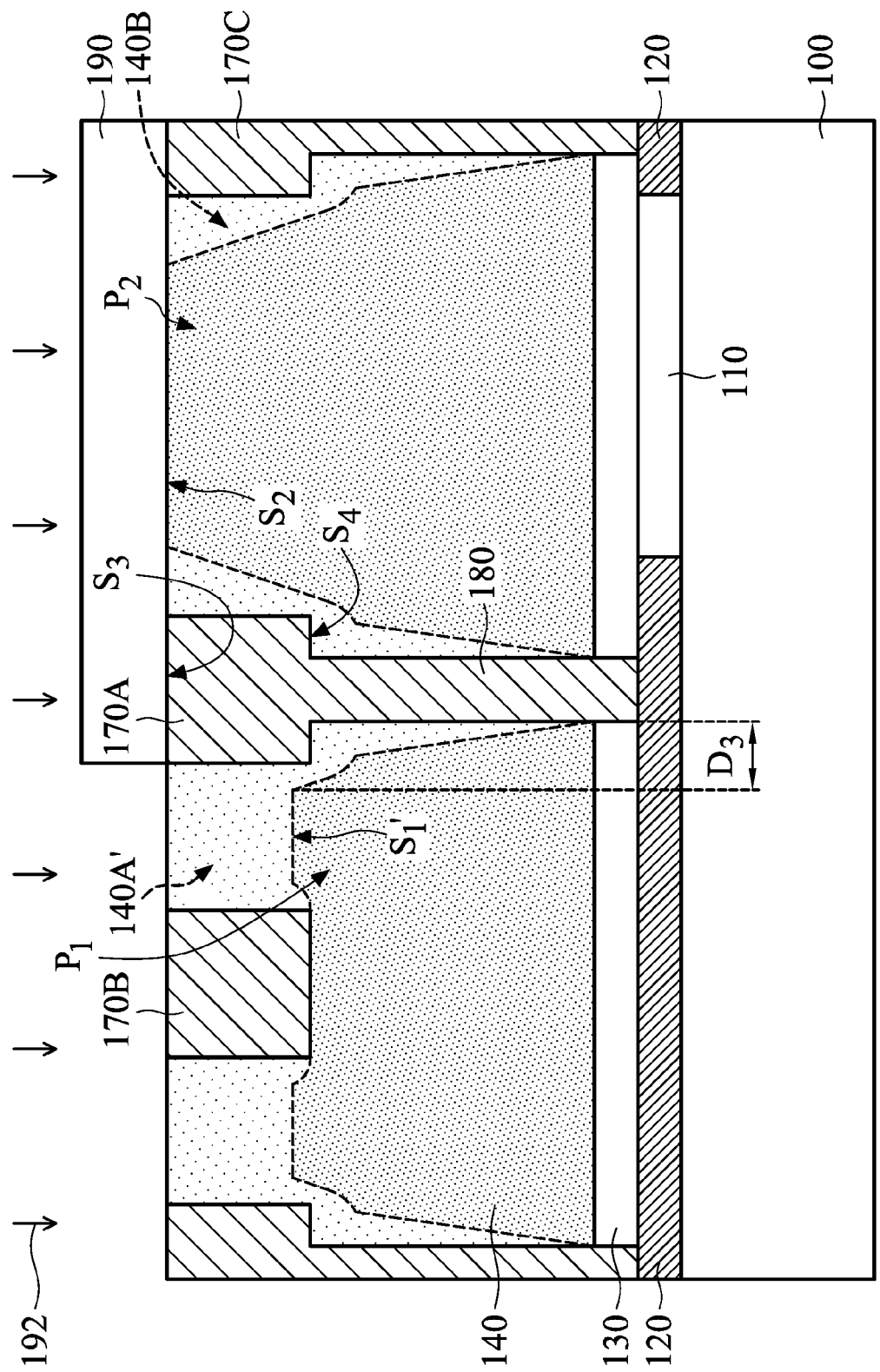

In some embodiments, the second portion $P_2$ of the dielectric layer 140 between the conductive features 170A and 170C is covered by the patterned mask layer 190 and is not modified, as shown in FIGS. 1D and 1E. Embodiments of the disclosure are not limited thereto. In some other embodiments, the second portion $P_2$ is exposed from the opening of the patterned mask layer 190 and is modified.

In some embodiments, a lower portion of the first portion $P_1$ is separated from the conductive feature 180 by a portion of the portion 140A', as shown in FIG. 1E. In some embodiments, a distance $D_3$ between the lower portion of the first portion $P_1$ and the conductive feature 180 gradually becomes smaller along the direction from the top surface $S_3$ towards the bottom surface $S_4$.

As shown in FIGS. 1D and 1E, the top surface $S_1'$ of the remaining portion of the first portion $P_1$ that is not modified is lower than the top surface $S_1$ of the first portion $P_1$ before being modified, in accordance with some embodiments. The top surface $S_1'$ may be a flat surface, an uneven surface including a recess or protrusion, a curved surface, or a surface with another possible profile. An interface between the portion 140A' and the first portion $P_1$ may be observed using a spectrometer, such as an EELS.

In some embodiments, the bottom surface $S_4$ of the conductive feature 170A is closer to the top surface $S_1'$ than the top surface $S_3$ of the conductive feature 170A, as shown in FIG. 1E. In some embodiments, the top surface $S_1'$ is lower than the top surface $S_3$ and is higher than the bottom surface $S_4$. In some other embodiments, the top surface $S_1'$ is substantially coplanar with the bottom surface $S_4$.

In some embodiments, the upper portion of the first portion $P_1$ is modified to be removable by an etchant used in a subsequent etching process. In some embodiments, the upper portion of the first portion $P_1$ is modified to have different dielectric constants than the lower portion of the first portion $P_1$ (i.e., the remaining portion of the first portion $P_1$ that is not modified). For example, the dielectric constant of the upper portion of the first portion $P_1$ becomes greater than the lower portion of the first portion $P_1$. In some embodiments, the dielectric constant of the upper portion of the first portion $P_1$ after the modification operation 192 is substantially equal to the dielectric constant of the portions 140A and 140B.

In some embodiments, the carbon concentration of the upper portion of the first portion $P_1$ is changed due to the modification operation 192. In some embodiments, the upper portion of the first portion $P_1$ is oxidized. As a result, the carbon concentration of the upper portion of the first portion $P_1$ becomes less than that of the lower portion of the first portion $P_1$.

In some embodiments, the modification operation 192 is an ion treatment and/or a plasma-involved process not involving ion bombardment. In some embodiments, the modification operation 192 includes an oxygen-containing plasma process or another suitable process. In some embodiments, the reaction gas used in the modification operation 192 includes oxygen, nitrogen oxide, another suitable oxygen-containing gas, or a combination thereof. In some embodiments, the operation power used for performing the modification operation 192 is in a range from about 10 W to about 150 W.

In some embodiments, the conditions of the modification operation 192 are fine-tuned to modify the upper portion of the first portion $P_1$. Accordingly, the portions 140A and the first portion $P_1$ are substantially not removed.

In some embodiments, a remote plasma process is performed to provide plasma over the dielectric layer 140 and the patterned mask layer 190. The portions 140A and the first portion $P_1$ are not directly exposed to plasma. As a result, the portions 140A and the first portion $P_1$ are substantially not removed during the modification operation 192. The conductive features 170A and 170B may also be prevented from damage due to the remote plasma process.

In some embodiments, carbon in the upper portion of the first portion $P_1$ is partially scavenged during the modification operation 192. For example, carbon in the upper portion of the first portion $P_1$ is partially drawn out or depleted by oxygen ion in oxygen-containing plasma, another suitable ion, or a combination thereof. As a result, the carbon concentration of the upper portion of the first portion $P_1$ is reduced after performing the modification operation 192.

In some embodiments, the upper portion of the first portion $P_1$ becomes a carbon-deficient dielectric material while the lower portion of the first portion $P_1$ is still made of a carbon-sufficient dielectric material. The carbon-deficient dielectric material may include $SiOC_{x-z}$ ($0<z<x$), $SiC_{x-z}OH$ ($0<z<x$), $SiOC_{x-z}N$ ($0<z<x$), another suitable carbon-sufficient dielectric material, or a combination thereof. The carbon concentration of the upper portion of the first portion $P_1$ may be substantially equal to or different from that of the portions 140A and 140B.

In some embodiments, the top surface of the conductive feature 170B is exposed from the opening of the patterned mask layer 190, as shown in FIGS. 1D and 1E. The top surface of the conductive feature 170B may be oxidized during the modification operation 192. In some embodiments, a clean treatment is performed over the conductive feature 170B. In some embodiments, a solution is used to remove an oxidized portion of the top surface of the conductive feature 170B. In some embodiments, a pH-value of the solution is in a range from about 7 to about 9.

Figure 1F:
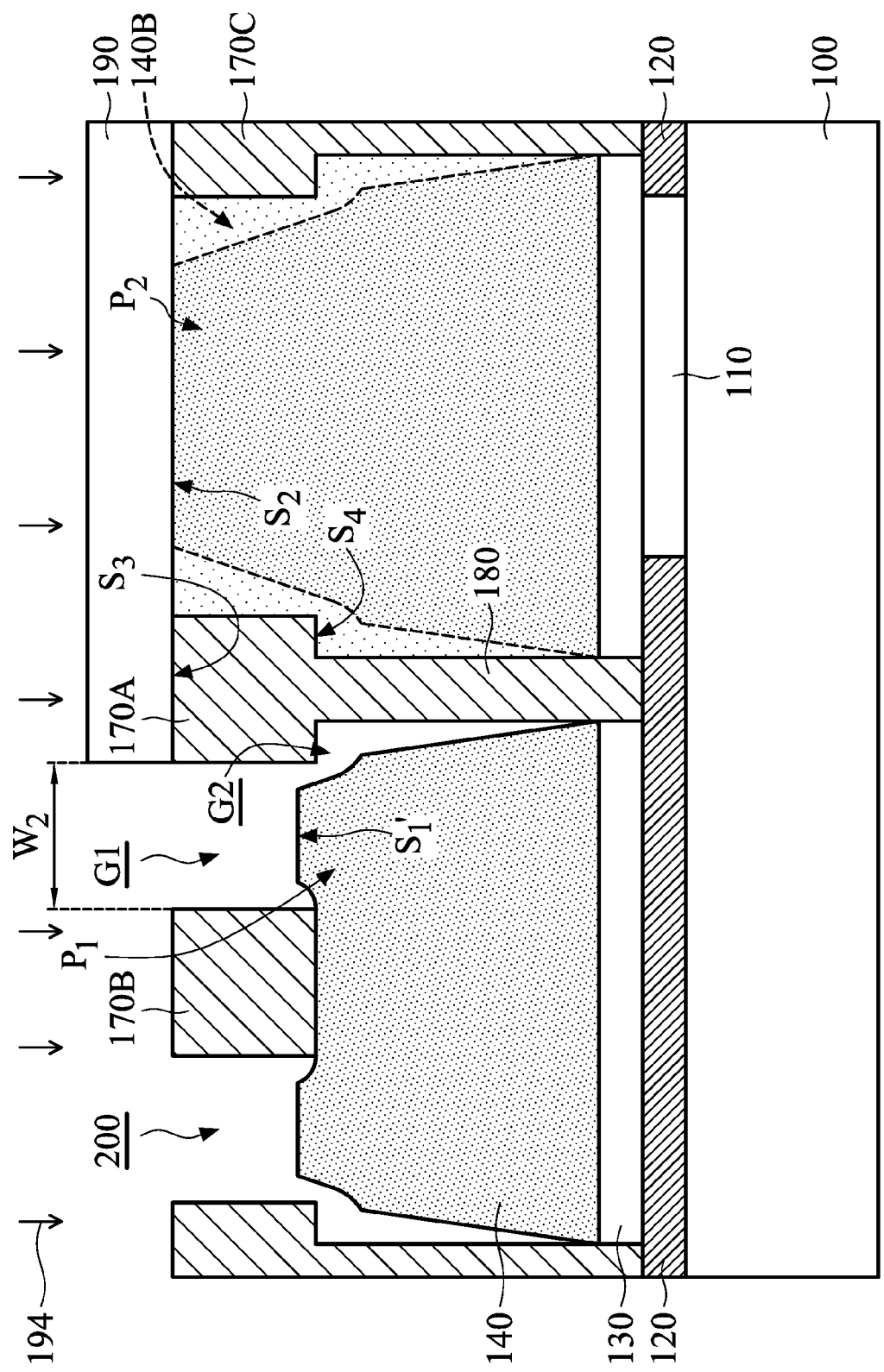

As shown in FIG. 1F, the portion 140A' of the dielectric layer 140 is removed, in accordance with some embodiments. As a result, the remaining portion of the first portion $P_1$ that is not modified by the modification operation 192 is exposed. In some embodiments, only a little of the dielectric layer 140 is left between the conductive features 170A and 170B. In some other embodiments, there is substantially no dielectric layer 140 left between the conductive features 170A and 170B.

As shown in FIG. 1F, the conductive features 170A, 170B, and 180, and the remaining portion of the first portion $P_1$ together surround one or more gaps including a gap 200, in accordance with some embodiments. The gap 200 is used to provide further electrical isolation between the conductive features 170A and 170B. In some embodiments, the gap 200 is an air gap.

As shown in FIG. 1F, the gap 200 has a first portion $G_1$ and a second portion $G_2$, in accordance with some embodiments. In some embodiments, the first portion $G_1$ has a width $W_2$ that is substantially equal to the distance $D_1$ between the conductive features 170A and 170B. In some embodiments, the first portion $G_1$ is not thicker than the conductive features 170A and 170B. In some embodiments, the first portion $G_1$ extends along the conductive features 170A and 170B as viewed from a top view. The top view may be taken along a plane that is parallel to the main surface of the semiconductor substrate 100.

In some embodiments, the second portion $G_2$ is in communication with the first portion $G_1$ and vertically extends from the first portion $G_1$ along the conductive feature 180. In some embodiments, the second portion $G_2$ is narrower than the first portion $G_1$. In some embodiments, the second portion $G_2$ gradually becomes narrower along the direction from the top surface $S_3$ towards the bottom surface $S_4$. In some other embodiments, a little of the portion 140A' is left between the first portion $P_1$ of the dielectric layer 140 and the conductive feature 180.

As shown in FIG. 1F, an etching process 194 is performed over the dielectric layer 140 and the patterned mask layer 190 to remove the portion 140A', in accordance with some embodiments. Afterwards, the patterned mask layer 190 is removed. In some embodiments, the etching process 194 is a dry etching process, such as an isotropic etching process.

In accordance with some embodiments, a vapor is used as an etchant in the etching process 194. In some embodiments, the vapor includes a vapor containing HF, another suitable vapor, or a combination thereof. In some embodiments, the vapor substantially does not react with the conductive features 170A and 170B. As a result, the sidewalls of the conductive features 170A and 170B are prevented from being bombarded and damaged during the removal of the portion 140A'.

In some embodiments, a dielectric material having a higher dielectric constant is removable by the vapor while a dielectric material having a lower dielectric constant is substantially not removable by the vapor. In some embodiments, a carbon-deficient dielectric material is removable by the vapor while a carbon-sufficient dielectric material is substantially not removable by the vapor.

In some embodiments, the portion 140A' is more susceptible to the vapor than the remaining portion of the first portion $P_1$ that is not modified by the modification operation 192. In some embodiments, the vapor has sufficiently high etch selectivity of the portion 140A' to the un-modified portion of the first portion $P_1$. Therefore, the vapor selectively removes the portion 140A' and substantially does not react with the remaining portion of the first portion $P_1$.

In some embodiments, the portions 140B of the dielectric layer 140 are covered by the patterned mask layer 190. The portions 140B are not modified and removed. As a result, there is no gap, such as an air gap, in the dielectric layer 140 between conductive features 170A and 170C. Therefore, the dielectric layer 140 between conductive features 170A and 170C provides a flat surface. The dielectric layer 140 also has sufficient structural strength to support layers and features subsequently formed over the dielectric layer 140.

Embodiments of the disclosure are not limited thereto. In some other embodiments, one or more of the portions 140B are exposed from the opening of the patterned mask layer 190. Afterwards, the exposed portions 140B are removed, for example, by performing an etching process. As a result, more gaps, such as air gaps, are formed in the dielectric layer 140 to provide enhanced electrical isolation between the conductive features.

Many variations and/or modifications can be made to embodiments of the disclosure. In some other embodiments, the upper portion of the first portion $P_1$ is not modified and the portion 140A' is not formed. In some embodiments, the portions 140A shown in FIG. 1C are directly removed by an etching process using a vapor as an etchant. In some embodiments, the portions 140B shown in FIG. 1C are also directly removed.

In some cases, a gap is formed in a dielectric layer by performing a plasma process. Some portions of the dielectric layer surrounding the gap may be bombarded with ions during the plasma process. Therefore, it is difficult to control the profile and size of the gap. The dielectric layer with the gap may be insufficiently strong to support a conductive feature surrounded by the gap.

In accordance with some embodiments, the conditions of the modification operation 192 can be fine-tuned to adjust the profile and size of the portion 140A'. The gap 200 is subsequently formed by removing the portion 140A'. Therefore, it can be ensured that the size of the gap 200 can be as large as possible but the first portion $G_1$ of the gap 200 is not thicker than the conductive features 170A and 170B. As a result, parasitic capacitance between the conductive lines is mitigated due to the magnified gap 200. Also, the conductive features 170A and 170B are sufficiently supported by the dielectric layer 140.

Figure 1G:
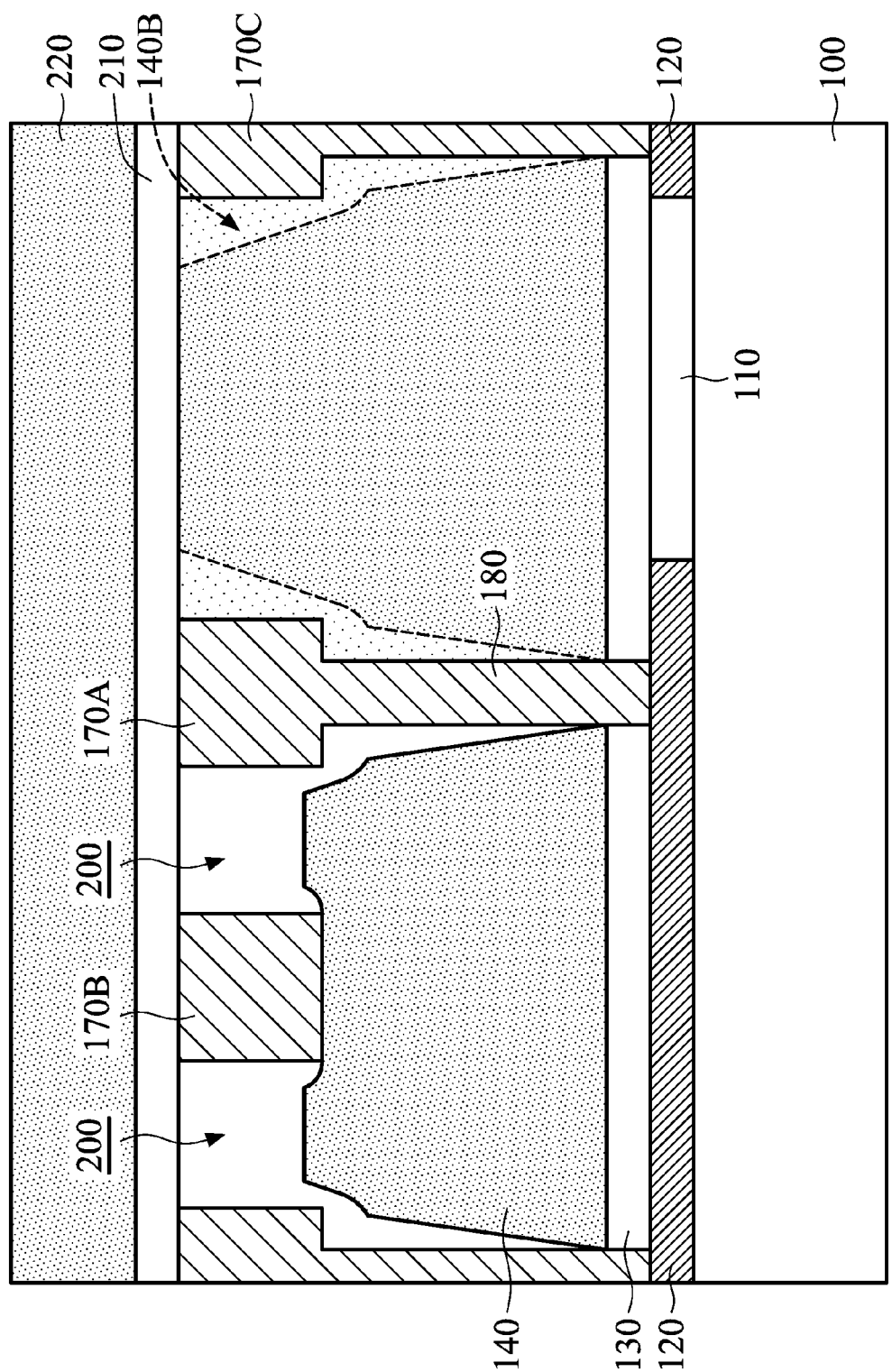

As shown in FIG. 1G, an etch stop layer 210 is deposited over the dielectric layer 140 and the conductive features 170A, 170B, and 170C, in accordance with some embodiments. In some embodiments, the etch stop layer 210 covers the gap 200 without filling it. In some other embodiments, the etch stop layer 210 covers the gap 200 and slightly extends into it without fully filling it.

Embodiments of the disclosure are not limited thereto. In some other embodiments, the etch stop layer 210 conformally extends along the sidewalls and the bottom surface of the gap 200 without fully filling it. In some embodiments, the gap 200 is not sealed by the etch stop layer 210 conformally extending in the gap 200. In some other embodiments, the gap 200 is sealed by the etch stop layer 210. The gap 200 may be continuously and completely surrounded by the etch stop layer 210.

The material and/or the formation method of the etch stop layer 210 are similar to or the same as those/that of the etch stop layer 130. However, many variations and/or modifications can be made to embodiments of the disclosure. In some other embodiments, the etch stop layer 210 is not formed.

As shown in FIG. 1G, a dielectric layer 220 is deposited over the etch stop layer 210, in accordance with some embodiments. In some embodiments, the dielectric layer 220 covers the gap 200 without filling it. In some other embodiments, the dielectric layer 220 covers the gap 200 and slightly extends into it without fully filling it. The material and/or the formation method of the dielectric layer 220 are similar to or the same as those/that of the dielectric layer 140.

In some embodiments, the dielectric constant of the portions 140A, 140A' or 140B is greater than that of the dielectric layer 220. In some embodiments, the carbon concentration or content of the portions 140A, 140A' or 140B is less than that of the dielectric layer 220.

In some embodiments, the processes illustrated in FIGS. 1B-1G are repeated one or more times to form one or more dielectric layers and conductive features. As a result, an interconnection structure including multiple dielectric layers and multiple conductive features is formed over the semiconductor substrate 100.

Embodiments of the disclosure provide a formation method of a semiconductor device structure. There are a first portion and a second portion of the dielectric layer between conductive features. The first portion surrounding one of the conductive features has a different dielectric constant or carbon concentration than the second portion. The second portion is subsequently modified to change its dielectric constant or carbon concentration. Afterwards, the first and second portions are removed by performing an etching process using a vapor to form a gap between the conductive features. As a result, sidewalls of the conductive features are prevented from being damaged during the formation of the gap. Since the second portion is modified and becomes removable by the vapor, the size of the gap is increased. As a result, parasitic capacitance between the conductive features is mitigated or eliminated. Therefore, the RC delay of the semiconductor device structure is greatly reduced.

The modification is fine-tuned to accurately adjust the size and profile of the subsequently formed gap. The modification is also selectively performed over the dielectric layer. It can be ensured that the dielectric layer with the gap provides sufficient support to the conductive features and other layers and features over the dielectric layer. As a result, the gap is enlarged without severely degrading the mechanical strength of the dielectric layer. Therefore, the device performance and reliability of the semiconductor device structure is significantly enhanced.

In some embodiments, the formation method shown in FIGS. 1A-1G is used to form a gap between dual damascene structures in an interconnection structure of a semiconductor device structure. Many variations and/or modifications can be made to embodiments of the disclosure. In some other embodiments, the formation method described in the disclosure can be used to form a gap between single damascene structures in an interconnection structure of a semiconductor device structure Embodiments of the disclosure are not limited thereto. In some other embodiments, the formation method described in the disclosure can be used to form any suitable opening in a dielectric layer.

In accordance with some embodiments, a method for forming a semiconductor device structure is provided. The method includes forming a dielectric layer over a semiconductor substrate. The method also includes forming an opening in the dielectric layer. A dielectric constant of a first portion of the dielectric layer is less than that of a second portion of the dielectric layer surrounding the opening. The method further includes forming a conductive feature in the opening. The second portion is between the first portion and the conductive feature. In addition, the method includes modifying an upper portion of the first portion to increase the dielectric constant of the upper portion of the first portion. The method also includes removing the upper portion of the first portion and the second portion.

In accordance with some embodiments, a method for forming a semiconductor device structure is provided. The method includes forming a dielectric layer over a semiconductor substrate. The method also includes forming a first opening and a second opening in the dielectric layer. A first portion of the dielectric layer surrounds the first opening. A second portion of the dielectric layer surrounds the second opening. A dielectric constant of the first portion and a dielectric constant of the second portion are changed during the formation of the first opening and the second opening. The method further includes respectively forming a first conductive feature and a second conductive feature in the first opening and the second opening. In addition, the method includes modifying a third portion of the dielectric layer between the first portion and the second portion to change a dielectric constant of the third portion. The method also includes removing the first portion, the second portion, and the third portion to form a gap between the first conductive feature and the second conductive feature.

In accordance with some embodiments, a semiconductor device structure is provided. The semiconductor device structure includes a dielectric layer over a semiconductor substrate. The semiconductor device structure also includes a first conductive feature in the dielectric layer. A portion of the dielectric layer has a top surface that is non-coplanar with a top surface of the first conductive feature. The semiconductor device structure further includes a second conductive feature in the dielectric layer and extending from a bottom surface of the first conductive feature. The portion of the dielectric layer is separated from the second conductive feature by a gap. A distance between the portion of the dielectric layer and the second conductive feature gradually becomes smaller along a direction from the top surface of the first conductive feature towards the bottom surface of the first conductive feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
    forming a dielectric layer over a semiconductor substrate;
    forming an opening in the dielectric layer, wherein a dielectric constant of a first portion of the dielectric layer is less than that of a second portion of the dielectric layer surrounding the opening;
    forming a conductive feature in the opening, wherein the second portion is between the first portion and the conductive feature;
    modifying an upper portion of the first portion to increase the dielectric constant of the upper portion of the first portion; and
    removing the upper portion of the first portion and the second portion.

2. The method for forming a semiconductor device structure as claimed in claim 1, wherein the first portion of the dielectric layer contains carbon, and the upper portion of the first portion is modified by partially removing carbon in the upper portion of the first portion.

3. The method for forming a semiconductor device structure as claimed in claim 1, wherein the second portion is between a lower portion of the first portion and the conductive feature, and a vapor is used to remove the upper portion of the first portion and the second portion, and the lower portion of the first portion is substantially not removed by the vapor.

4. The method for forming a semiconductor device structure as claimed in claim 1, further comprising forming a mask layer over the dielectric layer and the conductive feature before the modification, wherein the first portion and the second portion are exposed from the mask layer.

5. The method for forming a semiconductor device structure as claimed in claim 4, wherein the dielectric constant of the upper portion of the first portion is less than that of a third portion of the dielectric layer before the modification, and the third portion is adjacent to the conductive feature and is covered by the mask layer.

6. The method for forming a semiconductor device structure as claimed in claim 1, further comprising forming a second dielectric layer over the dielectric layer and the conductive feature, wherein the dielectric constant of the upper portion of the first portion after the modification is greater than that of the second dielectric layer.

7. A method for forming a semiconductor device structure, comprising:
    forming a dielectric layer over a semiconductor substrate;
    forming a first opening and a second opening in the dielectric layer, wherein a first portion of the dielectric layer surrounds the first opening and a second portion of the dielectric layer surrounds the second opening, and a dielectric constant of the first portion and a dielectric constant of the second portion are changed during the formation of the first opening and the second opening;
    respectively forming a first conductive feature and a second conductive feature in the first opening and the second opening;
    modifying a third portion of the dielectric layer between the first portion and the second portion to change a dielectric constant of the third portion; and
    removing the first portion, the second portion, and the third portion to form a gap between the first conductive feature and the second conductive feature.

8. The method for forming a semiconductor device structure as claimed in claim 7, wherein the dielectric constant of the first portion and the dielectric constant of the second portion are increased during the formation of the first opening and the second opening.

9. The method for forming a semiconductor device structure as claimed in claim 7, wherein the dielectric constant of the third portion is increased during the modification.

10. The method for forming a semiconductor device structure as claimed in claim 7, wherein the dielectric constant of the third portion before the modification is less than the dielectric constant of the first portion and the dielectric constant of the second portion.

11. The method for forming a semiconductor device structure as claimed in claim 7, wherein the dielectric constant of the third portion after the modification is substantially equal to the dielectric constant of the first portion and the dielectric constant of the second portion.

12. The method for forming a semiconductor device structure as claimed in claim 7, wherein the modification comprises performing an oxygen-containing plasma process over the first portion, the second portion, and the third portion.

13. A method for forming a semiconductor device structure, comprising:
    forming a dielectric layer over a semiconductor substrate;
    forming a first conductive feature in the dielectric layer;
    forming a second conductive feature in the dielectric layer extending from a bottom surface of the first conductive feature, wherein a first portion of the dielectric layer surrounds the first conductive feature and the second conductive feature, and wherein the first portion of the dielectric layer is sandwiched between the first conductive feature and a second portion of the dielectric layer;
    reducing a carbon concentration of the second portion of the dielectric layer; and
    removing the first portion and the second portion of the dielectric layer to form a gap in the dielectric layer.

14. The method for forming a semiconductor device structure as claimed in claim 13, wherein the first portion of the dielectric layer is further sandwiched between the second conductive feature and a third portion of the dielectric layer, and wherein a carbon concentration of the third portion is not changed during the reduction of the carbon concentration of the second portion.

15. The method for forming a semiconductor device structure as claimed in claim 14, wherein a carbon concentration of the first portion is less than the carbon concentration of the third portion before the reduction of the carbon concentration of the second portion.

16. The method for forming a semiconductor device structure as claimed in claim 14, wherein a distance between the third portion of the dielectric layer and the second conductive feature gradually becomes smaller along a direction from the first conductive feature towards the second conductive feature.

17. The method for forming a semiconductor device structure as claimed in claim 13, further comprising forming a third conductive feature in the dielectric layer, wherein the third conductive feature is separated from the first conductive feature by the gap, and wherein the gap has a width that is substantially equal to a distance between the first conductive feature and the third conductive feature.

18. The method for forming a semiconductor device structure as claimed in claim 17, further comprising performing a clean treatment over the third conductive feature after the reduction of the carbon concentration of the second portion.

19. The method for forming a semiconductor device structure as claimed in claim 13, wherein the first portion of the dielectric layer is removable by a vapor before the reduction of the carbon concentration of the second portion, and wherein the second portion of the dielectric layer becomes removable by the vapor during the reduction of the carbon concentration of the second portion.

20. The method for forming a semiconductor device structure as claimed in claim 13, further comprising forming a mask layer over the dielectric layer before the reduction of the carbon concentration of the second portion, wherein the mask layer covers the first conductive feature and exposes the first portion and the second portion of the dielectric layer during the reduction of the carbon concentration of the second portion.

* * * * *